(12) United States Patent
Badakere et al.

(10) Patent No.: US 9,390,991 B2
(45) Date of Patent: *Jul. 12, 2016

(54) SEMICONDUCTOR DEVICE AND METHOD OF FORMING WAFER LEVEL GROUND PLANE AND POWER RING

(75) Inventors: Guruprasad G. Badakere, Singapore (SG); Zigmund R. Camacho, Singapore (SG); Lionel Chien Hui Tay, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 665 days.

This patent is subject to a terminal disclaimer.

(21) Appl. No.: 13/346,415

(22) Filed: Jan. 9, 2012

(65) Prior Publication Data
US 2012/0104601 A1 May 3, 2012

Related U.S. Application Data

(63) Continuation of application No. 12/905,797, filed on Oct. 15, 2010, now Pat. No. 8,097,943, which is a continuation of application No. 11/951,729, filed on Dec. 6, 2007, now Pat. No. 7,838,395.

(51) Int. Cl.
*H01L 23/31* (2006.01)
*H01L 23/58* (2006.01)
(Continued)

(52) U.S. Cl.
CPC .......... *H01L 23/3114* (2013.01); *H01L 21/568* (2013.01); *H01L 21/6835* (2013.01); *H01L 23/3157* (2013.01); *H01L 23/3171* (2013.01);
(Continued)

(58) Field of Classification Search
CPC ............ H01L 23/3185; H01L 23/3157; H01L 21/568; H01L 21/6835; H01L 23/3114; H01L 23/5389; H01L 23/5386; H01L 23/5226; H01L 23/528; H01L 23/5286; H01L 23/585; H01L 23/3441; H01L 24/82; H01L 24/18; H01L 24/96; H01L 24/20; H01L 23/481; H01L 23/50; H01L 23/051; H01L 23/492; H01L 2027/11881; H01L 23/48; H01L 23/498

See application file for complete search history.

(56) References Cited

U.S. PATENT DOCUMENTS 6,181,569 B1  1/2001  Chakravorty
6,368,896 B2  4/2002  Farnworth et al.
(Continued)

FOREIGN PATENT DOCUMENTS

JP  2004214501  7/2004

*Primary Examiner* — Phat X Cao
*Assistant Examiner* — Diana C Vieira
(74) *Attorney, Agent, or Firm* — Robert D. Atkins; Patent Law Group: Atkins and Associates, P.C.

(57) ABSTRACT

A semiconductor die has active circuits formed on its active surface. Contact pads are formed on the active surface of the semiconductor die and coupled to the active circuits. A die extension region is formed around a periphery of the semiconductor die. Conductive THVs are formed in the die extension region. A wafer level conductive plane or ring is formed on a center area of the active surface. The conductive plane or ring is connected to a first contact pad to provide a first power supply potential to the active circuits, and is electrically connected to a first conductive THV. A conductive ring is formed partially around a perimeter of the conductive plane or ring and connected to a second contact pad for providing a second power supply potential to the active circuits. The conductive ring is electrically connected to a second THV.

21 Claims, 8 Drawing Sheets

(51) Int. Cl.
*H01L 23/528* (2006.01)
*H01L 23/00* (2006.01)
*H01L 21/683* (2006.01)
*H01L 21/56* (2006.01)

(52) U.S. Cl.
CPC .......... *H01L 23/3185* (2013.01); *H01L 23/528* (2013.01); *H01L 23/5286* (2013.01); *H01L 23/585* (2013.01); *H01L 24/18* (2013.01); *H01L 24/82* (2013.01); *H01L 24/96* (2013.01); H01L 2224/04105 (2013.01); H01L 2224/12105 (2013.01); H01L 2224/18 (2013.01); H01L 2224/32145 (2013.01); H01L 2924/014 (2013.01); H01L 2924/01005 (2013.01); H01L 2924/01006 (2013.01); H01L 2924/01013 (2013.01); H01L 2924/01029 (2013.01); H01L 2924/01047 (2013.01); H01L 2924/01061 (2013.01); H01L 2924/01078 (2013.01); H01L 2924/01079 (2013.01); H01L 2924/01082 (2013.01); H01L 2924/14 (2013.01); H01L 2924/15311 (2013.01); H01L 2924/15331 (2013.01); H01L 2924/181 (2013.01); H01L 2924/30105 (2013.01)

(56) References Cited

U.S. PATENT DOCUMENTS

| | | |
|---|---|---|
| 6,492,719 B2 | 12/2002 | Miyamoto et al. |
| 6,608,377 B2 | 8/2003 | Chang et al. |
| 2006/0197234 A1 | 9/2006 | Pape |
| 2006/0226451 A1* | 10/2006 | Davies .................. 257/210 |
| 2007/0209835 A1* | 9/2007 | Song et al. .............. 174/541 |
| 2009/0008793 A1 | 1/2009 | Pohl et al. |

* cited by examiner

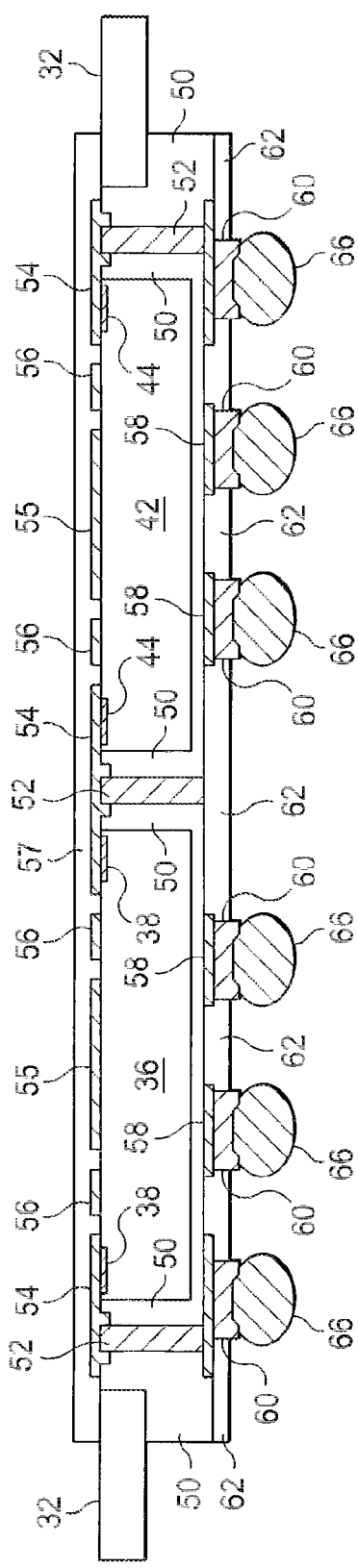
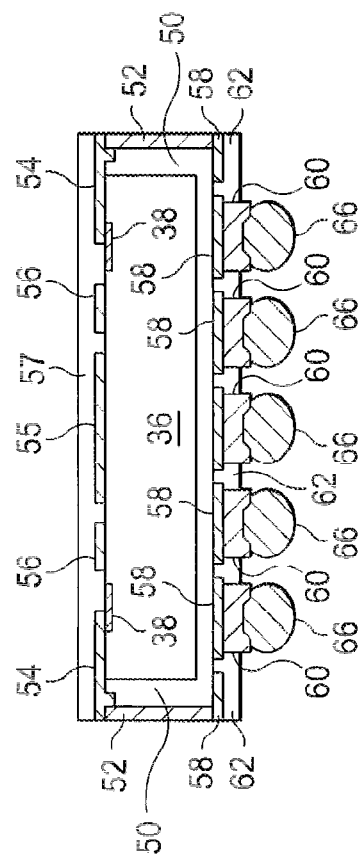

SEMICONDUCTOR DEVICE AND METHOD OF FORMING WAFER LEVEL GROUND PLANE AND POWER RING

CLAIM OF DOMESTIC PRIORITY

The present application is a continuation of U.S. patent application Ser. No. 12/905,797, filed Oct. 15, 2010, now U.S. Pat. No. 8,097,943, which is a continuation of U.S. application Ser. No. 11/951,729, filed Dec. 6, 2007, now U.S. Pat. No. 7,838,395.

FIELD OF THE INVENTION

The present invention relates in general to semiconductor devices and, more particularly, to a semiconductor device having wafer level ground plane or ring and power ring.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chips scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation length, lower capacitance, and achieve overall better circuit performance.

In many applications, it is desirable to optimize power and ground return paths to reduce parasitic capacitance. Some semiconductor packages have used power rings and ground rings to shorten the power and ground return paths. However, in WLCSP, space constraints make the use of power and ground rings difficult.

SUMMARY OF THE INVENTION

In one embodiment, the present invention is a method of making a semiconductor device including the steps of providing a semiconductor die with a plurality of contact pads, forming a die extension region around a periphery of the semiconductor die, forming a plurality of conductive vias in the die extension region around the periphery of the semiconductor die, forming a conductive plane on a center area of the semiconductor die and connected to a first one of the plurality of contact pads and a first one of the plurality of conductive vias at a level of the plurality of contact pads, forming a conductive ring partially around a perimeter of the conductive plane and connected to a second one of the plurality of contact pads and a second one of the plurality of conductive vias, and singulating the semiconductor device through the plurality of conductive vias.

In another embodiment, the present invention is a method of making a semiconductor device including the steps of providing a semiconductor die having an active surface, depositing a molding compound around a periphery of the semiconductor die to form a die extension region that covers sidewalls of the semiconductor die, forming a plurality of conductive vias in the die extension region, forming a conductive plane over the active surface of the semiconductor die to connect to a first contact pad on the active surface and a first one of the plurality of conductive vias, and forming a conductive ring partially around a perimeter of the conductive plane to connect to a second contact pad on the active surface and a second one of the plurality of conductive vias.

In another embodiment, the present invention is a method of making a semiconductor device including the steps of providing a semiconductor die, forming a die extension region around a periphery of the semiconductor die that covers sidewalls of the semiconductor die, forming a conductive plane over the semiconductor die to connect to the semiconductor die and a first conductive via in the die extension region, and forming a conductive ring partially around a perimeter of the conductive plane to connect to the semiconductor die and a second conductive via in the die extension region.

In another embodiment, the present invention is a semiconductor device including a semiconductor die. A die extension region is formed around a periphery of the semiconductor die and covers sidewalls of the semiconductor die. A conductive plane is formed over the semiconductor die to connect the semiconductor die to a first conductive via in the die extension region. A conductive ring is formed partially around a perimeter of the conductive plane to connect the semiconductor die and a second conductive via in the die extension region.

BRIEF DESCRIPTION OF THE DRAWINGS

FIGS. 2a-2e illustrate a process of forming a ground plane or ring and power ring connected to THVs around a periphery of the die;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
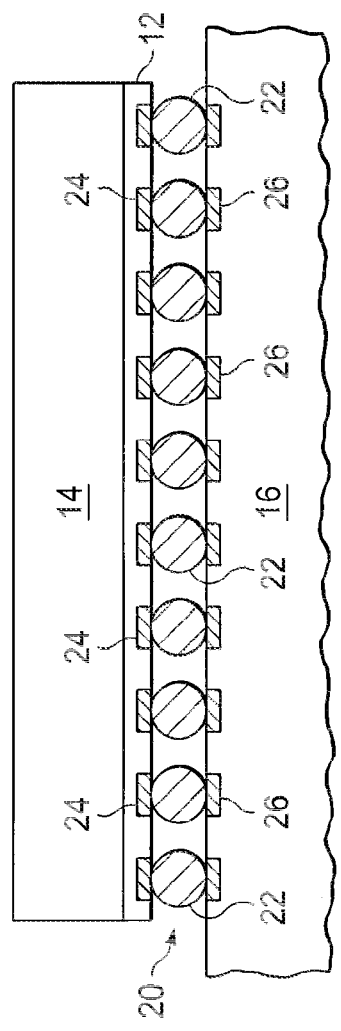
FIG. 1 is a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

FIGS. 2a-2e illustrate a process of forming THVs on a periphery of a semiconductor die in a wafer level chip scale package (WLCSP). The THVs are formed through a non-conductive passivation or polymer die extension region. In one process of forming THVs, the semiconductor die are formed on a semiconductor wafer using conventional integrated circuit processes, as described above. The semiconductor wafer is diced to separate the semiconductor die into individual units. The semiconductor die are then transferred onto a temporary chip carrier.

Figure 2A:
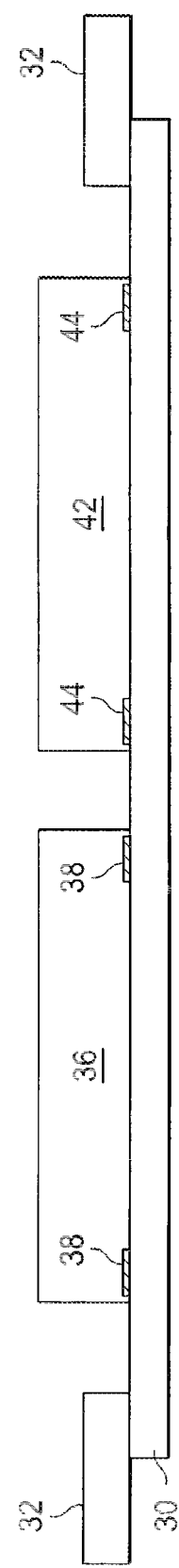

FIG. 2a shows coverlay tape 30 disposed between ends of chip carrier 32. Semiconductor die 36 is transferred and affixed to coverlay tape 30 using die attach material with its active surface and contact pads 38 oriented face down onto the tape. Likewise, semiconductor die 42 is transferred and affixed to coverlay tape 30 using die attach material with its active surface and contact pads 44 oriented face down onto the tape. Semiconductor die 36 and 42 can also be mounted to coverlay tape 30 using post wafer saw tape transfer.

Figure 2B:
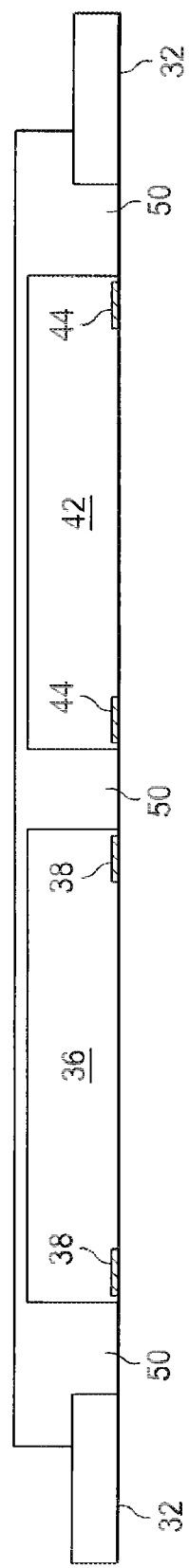

In FIG. 2b, a polymer molding compound 50 is deposited around a periphery of semiconductor die 36 and 42 down to coverlay tape 30. The polymer molding compound 50 forms a non-conductive die extension region around a periphery of semiconductor die 36 and 42. The coverlay tape is then peeled away to expose the contact pads and active front side of semiconductor die 36 and 42.

Figure 2C:
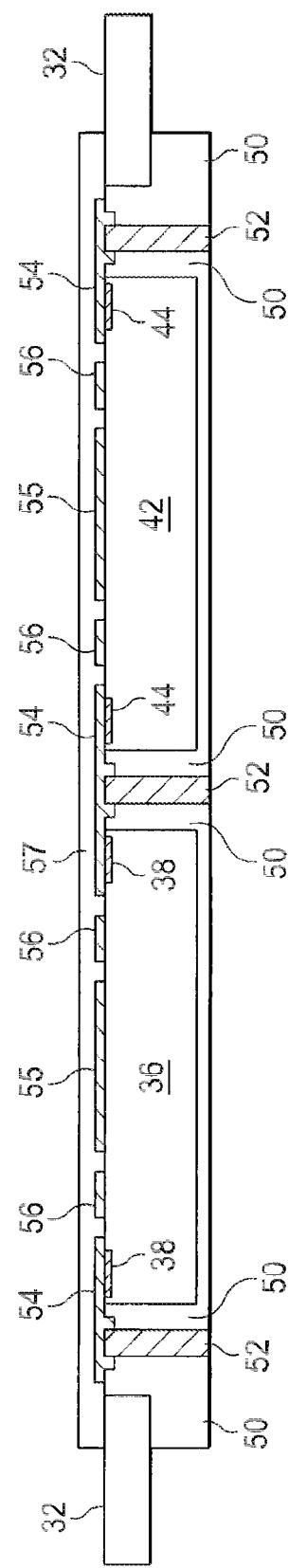

In FIG. 2c, the semiconductor die are inverted such that the contact pads and active front side of semiconductor die 36 and 42 face upward. THVs 52 are formed in the die extension region between semiconductor die 36 and 42 by etching, laser drilling, or other conventional method. An electrically conductive material is deposited in THVs 52 using an evaporation, electrolytic plating, electroless plating, or screen printing process. The conductive material can be aluminum (Al), copper (Cu), tin (Sn), nickel (Ni), gold (Au), or silver (Ag). A redistribution layer (RDL) 54 is formed between THVs 52 and the respective contact pads 38 and 44 of semiconductor die 36 and 42. RDLs 54 can be made with Al, aluminum copper alloy (AlCu), Cu, or Cu alloy. RDLs 54 operate as an intermediate conduction layer to route electrical signals between THVs 52 and contact pads 38 and 44. A passivation layer 57 is formed over RDLs 54, contact pads 38 and 44, and semiconductor die 36 and 42 for structural support and physical isolation. Passivation layer 57 can be made with silicon dioxide (SiO2), silicon oxynitride (SiON), silicon nitride (SixNy), polyimide (PI), benzocyclobutene (BCB), polybenzoxazole (PBO), or other insulating material.

A ground plane or ring 55 is formed on an active surface of semiconductor die 36 and 42. A power ring 56 is formed around ground plane or ring 55 on semiconductor die 36 and 42. Ground plane or ring 55 and power ring 56 can be made with Al, AlCu, Cu, or Cu alloy and deposited using an evaporation, electrolytic plating, electroless plating, or screen printing process. In another embodiment, plane or ring 55 is used for the power connection and ring 56 is used for the ground connection. A passivation layer 57 is formed over RDLs 54, contact pads 38, power ring 56, ground plane or ring 55, and semiconductor die 36 and 42 for structural support and physical isolation. Passivation layer 57 can be made with SiO2, SiON, SixNy, PI, BCB, PBO, or other insulating material.

In FIG. 2d, RDLs 58 are formed on a backside of the semiconductor die, opposite the active front side of the die, and electrically contact the backside of THVs 52. RDLs 54 can be made with Al, AlCu, Cu, or Cu alloy. An under bump metallization (UBM) 60 is deposited and patterned to electrically contact RDLs 58. In one embodiment, UBMs 60 may include a wetting layer, barrier layer, and adhesive layer. RDLs 58 operate as an intermediate conduction layer to route electrical signals between THVs 52 and UBMs 60. A passivation layer 62 is formed over RDLs 58 and transfer molding compound 50 for structural support and physical isolation. Passivation layer 62 can be made with SiO2, SiON, SixNy, PI, BCB, PBO, or other insulating material.

An electrically conductive solder material is deposited over UBMs 60 through an evaporation, electrolytic plating, electroless plating, ball drop, or screen printing process. The solder material can be any metal or electrically conductive material, e.g., Sn, lead (Pb), Ni, Au, Ag, Cu, bismuthinite (Bi) and alloys thereof, or mixtures of other electrically conductive material. In one embodiment, the solder material is 63 percent weight of Sn and 37 percent weight of Pb. The solder material is reflowed by heating the conductive material above its melting point to form spherical balls or bumps 66. In one embodiment, solder bumps 66 are about 75 μm in height. In some applications, solder bumps 66 are reflowed a second time to improve electrical contact to UBMs 60. UBMs 60 and solder bumps 66 represent one type of interconnect structure.

Semiconductor die 36 and 42 are singulated along the die extension region. The die extension region is cut by a cutting tool such as a saw or laser. The cutting tool completely severs the die extension region to separate the die.

FIG. 2e illustrates semiconductor die 36 following singulation of the die extension region through a center area of THVs 52. Each semiconductor die has a similar final configuration. Contact pads 38 electrically connect through RDLs 54, THVs 52, RDLs 58, and UBMs 60 to solder bumps 66, as shown in FIG. 2e. Ground plane or ring 55 and power ring 56 also connect through RDLs 54 to THVs 52.

Figure 3:
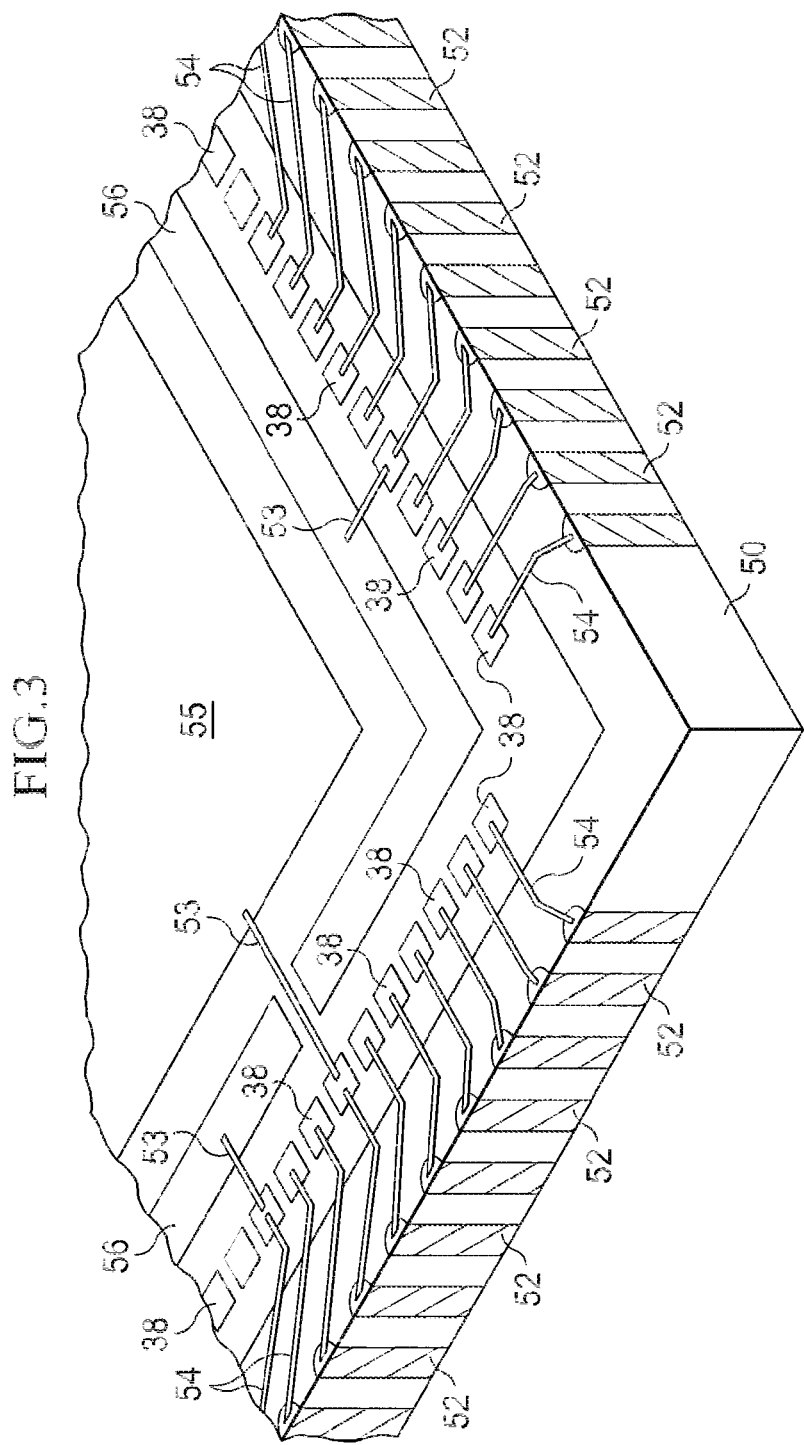
FIG. 3 illustrates an orthogonal view of the ground plane or ring and power ring connected to THVs around a periphery of the die.

Further detail of the ground plane or ring 55 and power ring 56 is shown in FIG. 3. Semiconductor die 36 has contact pads 38 formed on its active surface. RDLs 54 electrically connect contact pads 38 to THVs 52. Depending on the electrical interconnect of the active circuits, some of the contact pads 38 are electrically isolated from adjacent THVs 52, i.e., no connecting RDL is formed. Ground plane or ring 55 connects through RDLs 54 to THVs 52, which in turn connect through RDLs 58 and UBMs 60 to solder bumps 66. Likewise, power ring 56 connects through RDLs 54 to THVs 52, which in turn connect through RDLs 58 and UBMs 60 to solder bumps 66. The wafer level ground plane or ring 55 and power ring 56 provide shorter power and return path through THVs. The shorter path leads to less parasitic capacitance and enhanced electrical performance of the WLCSP package.

Figure 4A:
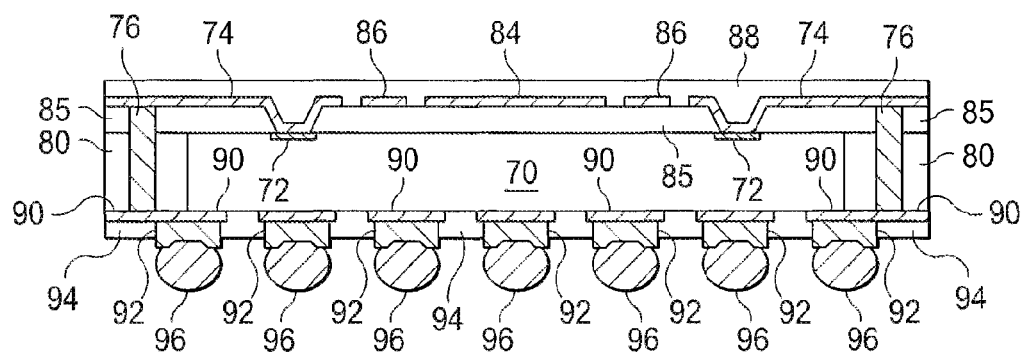
FIGS. 4a-4b illustrate the ground plane or ring and power ring formed on a passivation layer and connected to THVs around a periphery of the die.
Figure 4B:
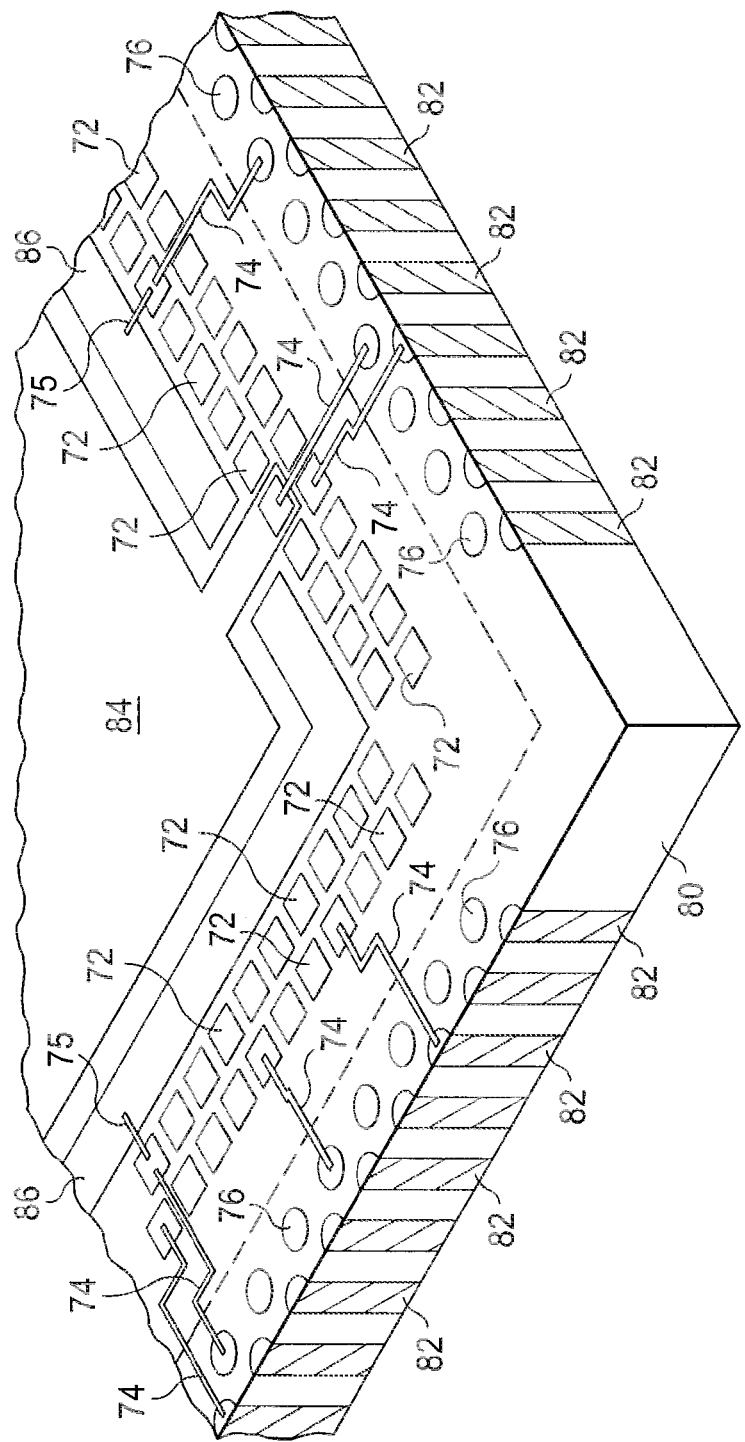

In FIGS. 4a-4b, semiconductor die 70 has contact pads 72 formed on its active surface. RDLs 74 electrically connect contact pads 72 to THVs 76. Depending on the electrical interconnect of the active circuits, some of the contact pads 72 are electrically isolated from adjacent THVs 76, i.e., no connecting RDL is formed. THVs 76 are formed in molding compound 80 which operates as the die extension region as described in FIGS. 2a-2e. In this embodiment, molding compound 80 is formed with sufficient width to contain THVs 76 (full vias) and THVs 82 (half vias).

A ground plane or ring 84 is formed on an active surface of semiconductor die 70. A power ring 86 is formed around ground plane or ring 84 on semiconductor die 36. Ground plane or ring 84 and power ring 86 can be made with Al, AlCu, Cu, or Cu alloy and deposited using an evaporation, electrolytic plating, electroless plating, or screen printing process. In another embodiment, plane or ring 84 is used for the power connection and ring 86 is used for the ground connection. A passivation layer 88 is formed over RDLs 74, contact pads 72, power ring 86, ground plane or ring 84, and semiconductor die 70 for structural support and physical isolation. Passivation layer 88 can be made with SiO2, SiON, SixNy, PI, BCB, PBO, or other insulating material.

RDLs 90 are formed on a backside of the semiconductor die, opposite the active front side of the die, and electrically contact the backside of THVs 76. RDLs 90 can be made with Al, AlCu, Cu, or Cu alloy. A UBM 92 is deposited and patterned to electrically contact RDLs 90. In one embodiment, UBMs 92 may include a wetting layer, barrier layer, and adhesive layer. RDLs 90 operate as an intermediate conduction layer to route electrical signals between THVs 76 and UBMs 92. A passivation layer 94 is formed over RDLs 90, semiconductor die 70, and molding compound 80 for structural support and physical isolation. Passivation layer 94 can be made with SiO2, SiON, SixNy, PI, BCB, PBO, or other insulating material.

An electrically conductive solder material is deposited over UBMs 92 through an evaporation, electrolytic plating, electroless plating, ball drop, or screen printing process. The solder material can be any metal or electrically conductive material, e.g., Sn, Pb, Ni, Au, Ag, Cu, Bi and alloys thereof, or mixtures of other electrically conductive material. The solder material is reflowed by heating the conductive material above its melting point to form spherical balls or bumps 96. In some applications, solder bumps 96 are reflowed a second time to improve electrical contact to UBMs 92. UBMs 92 and solder bumps 96 represent one type of interconnect structure.

Ground plane or ring 84 connects through RDLs 74 to THVs 76 or 82, which in turn connect through RDLs 90 and UBMs 92 to solder bumps 96. Likewise, power ring 86 connects through RDLs 74 to THVs 76 or 82, which in turn connect through RDLs 90 and UBMs 92 to solder bumps 96. The wafer level ground plane or ring 84 and power ring 86 provide shorter power and return path through THVs. The shorter path leads to less parasitic capacitance and enhanced electrical performance of the WLCSP package.

Figure 5A:
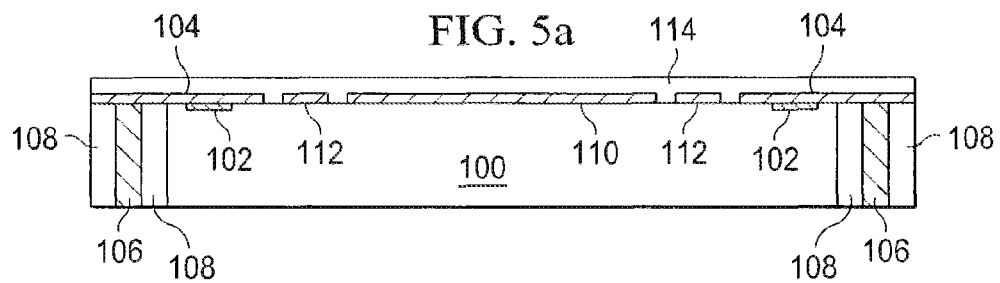
FIGS. 5a-5c illustrate the ground plane or ring and power ring connected to full via THVs around a periphery of the die.
Figure 5B:
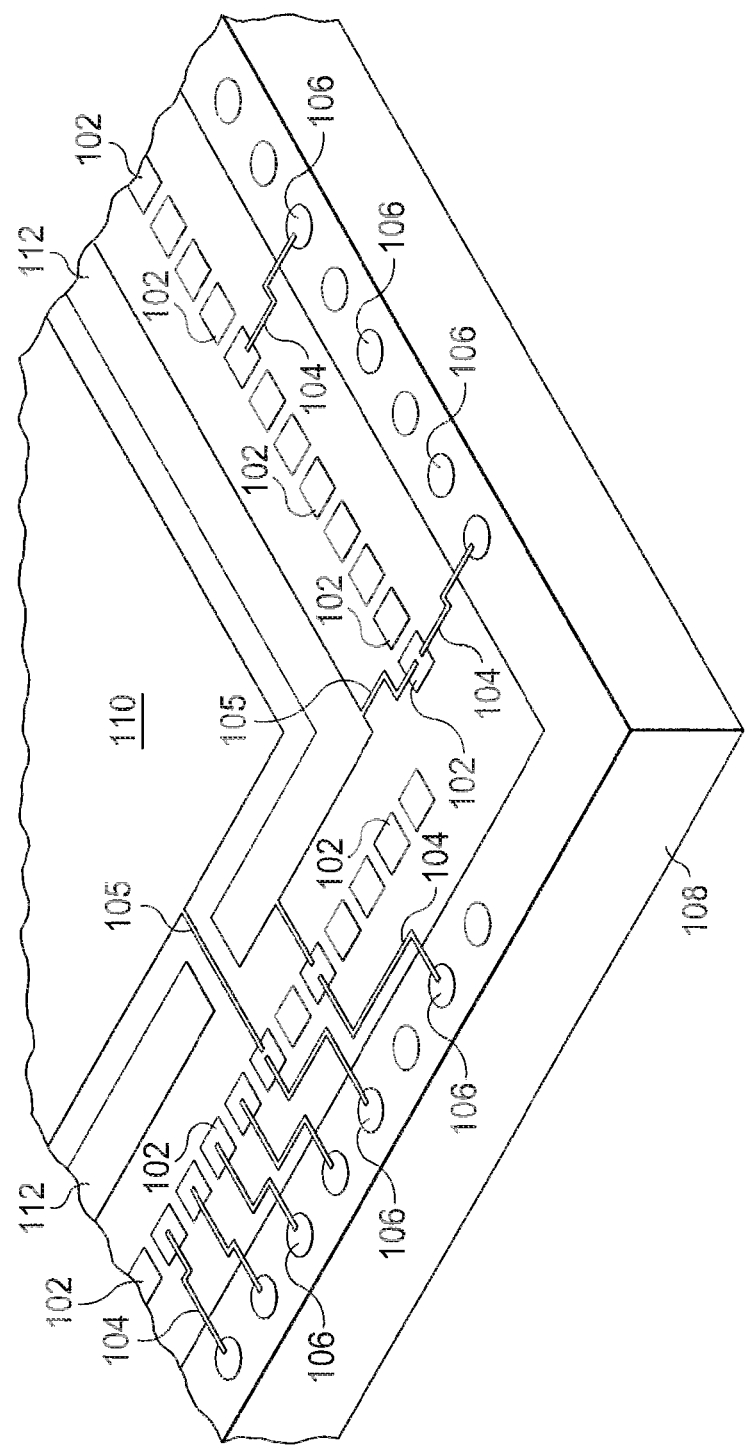

In FIGS. 5a-5b, semiconductor die 100 has contact pads 102 formed on its active surface. RDLs 104 electrically connect contact pads 102 to THVs 106. Depending on the electrical interconnect of the active circuits, some of the contact pads 102 are electrically isolated from adjacent THVs 106, i.e., no connecting RDL is formed. THVs 106 are formed in molding compound 108 which operates as the die extension region as described in FIGS. 2a-2d. In this embodiment, molding compound 108 is formed with sufficient width to contain THVs 106 (full vias).

Figure 5C:
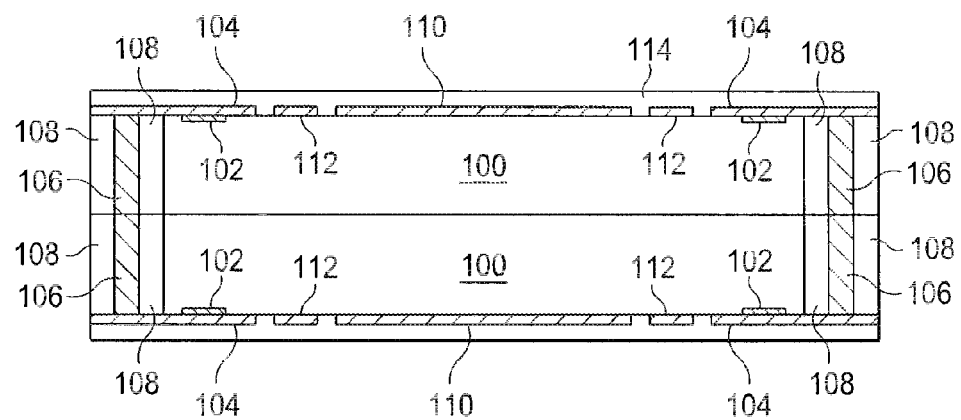

A ground plane or ring 110 is formed on an active surface of semiconductor die 100. A power ring 112 is formed around ground plane or ring 110 on semiconductor die 100. Ground plane or ring 110 and power ring 112 can be made with Al, AlCu, Cu, or Cu alloy and deposited using an evaporation, electrolytic plating, electroless plating, or screen printing process. In another embodiment, plane or ring 110 is used for the power connection and ring 112 is used for the ground connection. A passivation layer 114 is formed over RDLs 104, contact pads 102, power ring 112, ground plane or ring 110, and semiconductor die 100 for structural support and physical isolation. Passivation layer 114 can be made with SiO2, SiON, SixNy, PI, BCB, PBO, or other insulating material. A plurality of semiconductor die can be stacked and interconnected through THVs 106, as shown in FIG. 5c.

Figure 6:
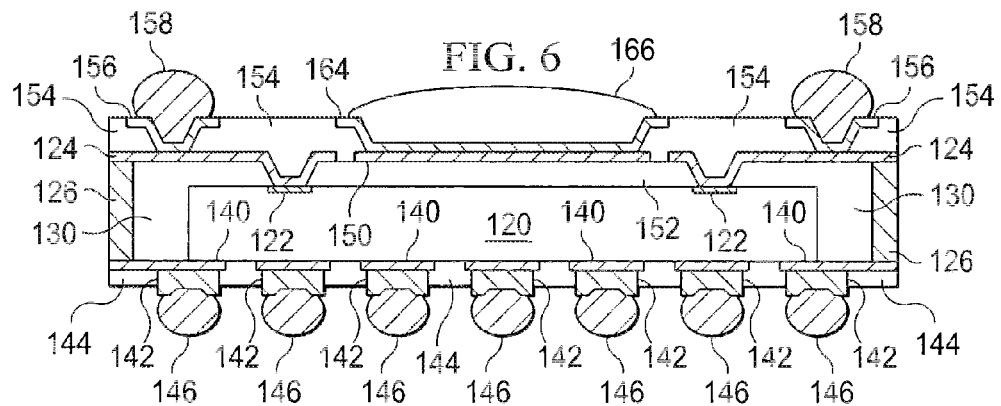
FIG. 6 illustrate the ground plane or ring connected to topside interconnects.

In FIG. 6, semiconductor die 120 has contact pads 122 formed on its active surface. RDLs 124 electrically connect contact pads 122 to THVs 126. Depending on the electrical interconnect of the active circuits, some of the contact pads 122 are electrically isolated from adjacent THVs 126, i.e., no connecting RDL is formed. THVs 126 are formed in molding compound 130 which operates as the die extension region as described in FIGS. 2a-2e. In this embodiment, molding compound 80 is formed with sufficient width to contain THVs 126 (half vias) and other THVs (full vias).

RDLs 140 are formed on a backside of the semiconductor die, opposite the active front side of the die, and electrically contact the backside of THVs 126. RDLs 140 can be made with Al, AlCu, Cu, or Cu alloy. A UBM 142 is deposited and patterned to electrically contact RDLs 140. In one embodiment, UBMs 142 may include a wetting layer, barrier layer, and adhesive layer. RDLs 140 operate as an intermediate conduction layer to route electrical signals between THVs 126 and UBMs 142. A passivation layer 144 is formed over RDLs 140, semiconductor die 120, and molding compound 130 for structural support and physical isolation. Passivation layer 144 can be made with SiO2, SiON, SixNy, PI, BCB, PBO, or other insulating material.

An electrically conductive solder material is deposited over UBMs 142 through an evaporation, electrolytic plating, electroless plating, ball drop, or screen printing process. The solder material can be any metal or electrically conductive material, e.g., Sn, Pb, Ni, Au, Ag, Cu, Bi and alloys thereof, or mixtures of other electrically conductive material. The solder material is reflowed by heating the conductive material above its melting point to form spherical balls or bumps 146. In some applications, solder bumps 146 are reflowed a second time to improve electrical contact to UBMs 142. UBMs 142 and solder bumps 146 represent one type of interconnect structure.

A ground plane or ring 150 is formed over insulating layer 152, which can be part of molding compound 130 or a passivation layer. A passivation layer 154 is formed over RDL 124. UBM 156 connects to RDL 124. Solder bump 158 is formed on UBM 156. UBM 164 connects to ground plane or ring 150. Solder bump 166 is formed on UBM 164. Solder bump 166 can also be used as a heat sink.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   depositing an encapsulant around a peripheral area of the semiconductor die to form a die extension region;
   forming a plurality of conductive vias through the encapsulant in the die extension region;
   forming a conductive plane over the semiconductor die and electrically connected to a first one of the conductive vias; and
   forming a conductive ring over the semiconductor die and electrically connected to a second one of the conductive vias.

2. The method of claim 1, further including coupling the conductive plane and conductive ring to the conductive vias.

3. The method of claim 1, further including forming the conductive plane over an active surface of the semiconductor die.

4. The method of claim 1, further including coupling the conductive plane or conductive ring to a contact pad of the semiconductor die.

5. A semiconductor device, comprising:
   a semiconductor die;
   an encapsulant deposited around a peripheral area of the semiconductor die to form a die extension region;
   a first conductive via disposed through the encapsulant in the die extension region;
   a conductive plane formed over the semiconductor die and coupled to the first conductive via;
   a second conductive via disposed through the encapsulant in the die extension region; and
   a conductive ring formed over the semiconductor die and coupled to the second conductive via.

6. The semiconductor device of claim 5, further including:
   a conductive layer formed over the semiconductor die; and
   a plurality of bumps formed over the conductive layer.

7. The semiconductor device of claim 5, further including an insulation layer formed between the semiconductor die and the conductive plane.

8. The semiconductor device of claim 5, wherein the conductive plane provides a first power supply potential to the semiconductor die and the conductive ring provides a second power supply potential to the semiconductor die.

9. The semiconductor device of claim 5, wherein the conductive plane is formed over an active surface of the semiconductor die.

10. The semiconductor device of claim 5, further including a heat sink disposed over the conductive plane.

11. A method of making a semiconductor device, comprising:
    providing a semiconductor die;
    depositing a molding compound in a die extension region around a peripheral area outside a footprint of the semiconductor die;
    forming a first conductive via and second conductive via through the molding compound in the die extension region;
    forming a conductive plane over the semiconductor die and electrically connected to the semiconductor die and first conductive via; and
    forming a conductive ring over the semiconductor die and electrically connected to the semiconductor die and second conductive via.

12. The method of claim 11, further including forming a first conductive layer over the semiconductor die.

13. The method of claim 11, further including forming a conductive layer over the semiconductor die opposite the conductive plane.

14. The method of claim 11, wherein the conductive plane provides a first power supply potential to the semiconductor die and the conductive ring provides a second power supply potential to the semiconductor die.

15. The method of claim 11, further including forming the conductive plane over an active surface of the semiconductor die.

16. A method of making a semiconductor device, comprising:
    providing a semiconductor die;
    depositing a molding compound in a peripheral region of the semiconductor die to form a die extension region;
    forming a plurality of conductive vias in the die extension region;
    forming a conductive plane over an active surface of the semiconductor die to connect to a first contact pad on the active surface and a first conductive via of the plurality of conductive vias; and
    forming a conductive ring partially around a perimeter of the conductive plane to connect to a second contact pad on the active surface and a second conductive via of the plurality of conductive vias, wherein the semiconductor device includes a wafer level chip scale package.

17. The method of claim 16, further including forming a conductive layer over a surface of the semiconductor die opposite the active surface and in electrical contact with the plurality of conductive vias.

18. The method of claim 16, further including forming the plurality of conductive vias into a first row of conductive vias and a second row of conductive vias offset from the first row of conductive vias.

19. The method of claim 16, wherein the conductive plane provides a first power supply potential to the semiconductor die and the conductive ring provides a second power supply potential to the semiconductor die.

20. The method of claim 16, further including:
   forming an under bump metallization over the conductive plane; and
   forming a bump on the under bump metallization.

21. The method of claim 16, wherein the conductive plane is formed over a center area of the active surface of the semiconductor die.

* * * * *